United States Patent
Ryat

[19]

[11] Patent Number: 6,134,060
[45] Date of Patent: Oct. 17, 2000

[54] CURRENT BIAS, CURRENT SENSE FOR MAGNETO-RESISTIVE PREAMPLIFIER, PREAMPLIFYING INTEGRATED CIRCUIT, AND RELATED METHODS

[75] Inventor: Marc H. Ryat, Santa Clara, Calif.

[73] Assignee: STMicroelectronics, Inc., Carrollton, Tex.

[21] Appl. No.: 08/872,809

[22] Filed: Jun. 10, 1997

[51] Int. Cl.[7] .................................................. G11B 5/09
[52] U.S. Cl. .............................. 360/46; 360/66; 360/67
[58] Field of Search ................................. 360/46, 66, 67, 360/113; 330/62, 290

[56] References Cited

U.S. PATENT DOCUMENTS

| | | | |
|---|---|---|---|
| 5,103,353 | 4/1992 | Jove et al. | 360/67 |
| 5,270,882 | 12/1993 | Jove et al. | 360/46 X |
| 5,812,019 | 9/1998 | Ngo | 360/66 X |
| 5,986,840 | 11/1999 | Tada et al. | 360/67 |

OTHER PUBLICATIONS

IEEE Transactions on Magnets, vol. 31, No. 2, Mar., 1995 pp. 1056–1061 "Read/Write Amplifier Design Considerations for MR Heads" Authors K.B. Klaassen and J.C.L. van Peppen.

*Primary Examiner*—Alan T. Faber
*Attorney, Agent, or Firm*—Therodore E. Galanthay; Lisa K. Jorgenson; Christopher F. Regan

[57] ABSTRACT

A current bias, current sense magneto-resistive preamplifier for a hard disk drive and related methods preferably includes an MR sensor responsive to a current bias for sensing a change in magnetic data flux and responsively providing a change in electrical resistance. A preamplifying circuit is preferably connected to the MR sensor for providing the current bias thereto and for amplifying a detected change in electrical resistance. The preamplifying circuit includes a sensor biasing circuit for providing the current bias to the MR sensor and an amplifying output circuit for providing an amplified output signal representative of the detected change in current bias to the MR sensor. The sensor biasing circuit preferably includes a current source, a first amplifying circuit connected to the MR sensor for sensing the change in electrical resistance therefrom, and a second amplifying circuit having a first input connected to the first amplifying circuit and a second input connected to the current source. The sensor biasing circuit also includes a transconductance amplifying circuit connected to first and second outputs of the second amplifying circuit and having an output connected to the first amplifying circuit for providing an output current proportional to the voltage difference at the first and second inputs thereof. The preamplifier further includes a capacitor connected to the preamplifying circuit for providing stability to at least a portion of the preamplifying circuit.

27 Claims, 3 Drawing Sheets

CURRENT BIAS, CURRENT SENSE FOR MAGNETO-RESISTIVE PREAMPLIFIER, PREAMPLIFYING INTEGRATED CIRCUIT, AND RELATED METHODS

FIELD OF THE INVENTION

The present invention relates to the field of hard disk drives and, more particularly, to magneto-resistive preamplifier circuits for hard-disk drives.

BACKGROUND OF THE INVENTION

Computers and various computer related systems have been developed over the years. Advancements in these computers and computer systems occur rapidly, especially with the competitive nature of the commercial marketplace. These computers often include a display or monitoring screen for monitoring data, one or more processors for processing data, and a hard-disk drive for storing and retrieving data. These hard-disk drives often take the form of a magnetic storage device which is a portion of the "recording channel front-end." This front-end of the hard disk drive, for example, includes a read/write transducer which operates as a recording head, an electronics module which includes a read pre-amplifier circuit and a write driver, and interconnections between the various heads and the electronics module. These electronics modules conventionally are placed close to the heads to keep the interconnections as short as possible.

A read pre-amplifier circuit for hard-disk drives often includes a magneto-resistive ("MR") element as the sensor. The MR element advantageously does not present as much bandwidth restriction as some other types of read elements, e.g., inductive. The MR preamplifier circuit generally has a very low level "read" signal which is generated by an MR sensor and which is detected by a low noise preamplifier circuit. The preamplifier circuit of the electronics module generally has to provide the "sense current" for reading the resistance changes of the energetically passive MR sensor. In some types of MR preamplifiers, this sense current also provides the circuit biasing needed so that the sense current doubles as the bias current. The MR sensor, for example, can be biased by either maintaining a constant current through it or by applying a certain constant voltage across it.

In all circuits, the MR sensor, whose electrical equivalent is a simple resistor of nominal value R (typically in the order of 10 to 50 ohms), detects a magnetic read signal from the hard-disk by sensing changes in magnetic data flux. A magneto-resistive effect causes the equivalent resistor value to change by a small fraction of R, e.g., a few tenths of a percent, resulting in a variation of the voltage programmed to bias the head in its most linear operating range. For most MR sensors, the nominal direct current ("DC") bias voltage across the head is about 100 to 500 mV, and is a function of head manufacturing characteristics. The preamplifier circuitry therefore should provide for both low-noise, digital-to-analog ("DAC") programmable current biasing of the head and very low-noise amplification of its signal.

In addition, some multiplexing of the preamplifier input stage to different read heads should be provided, without compromising the noise performance. In most current-bias, current-sense architectures, where the head is directly biased by a current source controlled by a current-summing DAC and where the signal voltage is connected to a low input-impedance preamplifier input stage, two large external decoupling capacitors are usually required to eliminate the noise contributions from the bias current source itself and from the analog circuitry connected to the base (or the gate for MOS input stages) of the preamplifier input transistor. The need for offset removal within the preamplifier also calls for the use of a large capacitor which is, however, usually combined with one of the others so as not to increase external component count.

As an example, in FIG. 3 of the article titled "*Read/Write Amplifier Design Considerations For MR Heads,*" by Klaassen et al., IEEE Transactions ON Magnetics, Vol. 31, No. 2 (March 1995), pp. 1056–1061, such an implementation is shown where a first external capacitor C decouples the gate of the input low-noise device, while a second external capacitor (not shown) is used to implement a low-noise current source $I_b$. One drawback of this particular example is the fact that the low-noise current source $I_b$ is directly connected to the drain of the input transistor and severely limits the amplifier bandwidth which is another critical parameter of the circuit.

SUMMARY OF THE INVENTION

In view of the foregoing background, the present invention advantageously provides a current-sense preamplifier circuit which requires only one supply voltage or power supply and which requires only one external decoupling capacitor. The present invention also provides a preamplifying integrated circuit having an internal capacitor which is decreased in size to the point of allowing its implementation inside the monolithic chip of the integrated circuit. The present invention additionally advantageously provides a constant current biasing preamplifier circuit which has a low-noise current bias and a low-noise signal amplification and which does not severely limit the bandwidth of the amplifying circuit. The present invention further provides a preamplifying integrated circuit implementation which uses simple electronics, saves chip space or area, and maintains tight electronic tolerances.

These and other advantages, features, and benefits in accordance with the present invention are provided by a preamplifier for a hard disk drive. The preamplifier preferably includes a magneto-resistive (MR) sensor responsive to a current bias for sensing a change in magnetic data flux and responsively providing a change in electrical resistance. The preamplifier also includes preamplifying means connected to a supply voltage and to the MR sensor for providing a current bias to the MR sensor and for amplifying a detected change in electrical resistance from the MR sensor. The preamplifying means includes a current-source sensor biasing circuit for providing a desired biasing current to the MR sensor and an amplifying output circuit connected to the current-source sensor biasing circuit for providing an amplified output signal representative of the detected change in biasing current supplied to the MR sensor due to the change in electrical resistance. The current-source sensor biasing circuit preferably includes a current source for generating a source current, a first amplifying circuit connected to the MR sensor and to a supply voltage for sensing the change in electrical resistance from the MR sensor, a second amplifying circuit having a first input connected to the first amplifying circuit and a second input connected to the current source for amplifying a voltage difference between the first and second inputs, and a transconductance amplifying circuit having first and second differential inputs respectively connected to first and second outputs of the second amplifying circuit and having an output connected to the first amplifying circuit for providing an output current proportional to the voltage difference at the first and second inputs thereof. The preamplifier further includes stabilizing means connected to the preamplifying means and to ground for stabilizing at least a portion of the preamplifying means.

The preamplifying means of the preamplifier is preferably provided by a preamplifying integrated circuit adapted to be connected to a supply voltage and to a MR sensor for providing a current bias to the MR sensor and for detecting the change in electrical resistance from the MR sensor. The preamplifying integrated circuit preferably includes a substrate and a current-source sensor biasing circuit formed on the substrate for providing the current bias to the MR sensor. The current-source sensor biasing circuit includes a current source for generating a source current and a current biasing loop circuit responsive to the current source for providing the biasing current to an MR sensor and for sensing a change in the biasing current responsive to a change in the electrical resistance of the MR sensor. The current biasing loop circuit has a first amplifying circuit adapted to be connected to an MR sensor for biasingly driving the MR sensor so as to detect the change in electrical resistance and a second amplifying circuit having a first input connected to the first amplifying circuit and a second input connected to the current source for amplifying the difference between the first and second inputs. The current biasing loop circuit also preferably includes a transconductance amplifying circuit having first and second inputs respectively connected to first and second outputs of the second amplifying circuit and having an output connected to the first amplifying circuit and adapted to be connected to an external capacitor for providing an output current proportional to the voltage difference at the first and second inputs thereof. The output current of the transconductance amplifier advantageously drives the first amplifying circuit so as to bias the MR sensor. The preamplifying integrated circuit also includes an amplifying output circuit formed on the substrate and connected to the current-source sensor biasing circuit for providing an amplified output signal representative of the change in current bias to the MR sensor due to the change in electrical resistance.

The present invention also advantageously provides methods of biasing an MR sensor so as to detect a change in the electrical resistance of the MR sensor. A method according to the present invention preferably includes generating a reference voltage responsive to a source current and a supply voltage and providing a first amplifying circuit responsive to the supply voltage to thereby generate an initial biasing voltage so as to supply an initial biasing current across the MR sensor and to thereby amplify a sensed change in the biasing current. The method also includes providing a second amplifying circuit having first and second inputs respectively connected to the reference voltage and the initial biasing voltage to amplify a difference between the reference voltage and the initial biasing voltage. A transconductance amplifier further provided and is connected to the first amplifying circuit and the outputs of the second amplifying circuit to thereby generate a driving current for the first amplifying circuit proportional to the determined voltage difference between the reference voltage and the initial biasing voltage so that the first amplifying circuit supplies a desired biasing current across the MR sensor.

Another method of biasing an MR sensor so as to detect a change in the electrical resistance of the MR sensor according to the present invention preferably includes generating a reference voltage responsive to a source current and generating a biasing voltage approximately equal to the reference voltage responsive to a supply voltage so as to operate an MR sensor at a desired biasing current. The method also includes sensing a change in the biasing current across the MR sensor responsive to a change in magnetic data flux and changing the biasing voltage responsive to the changed biasing current. A voltage difference between the reference voltage and the changed biasing voltage is then amplified so as to provide an output signal representative of the detection of change in magnetic data flux by the MR sensor.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF A PREFERRED EMBODIMENT

The present invention will now be described more fully hereinafter with reference to the accompanying drawings which illustrate a preferred embodiment of the invention. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art.

Figure 1:
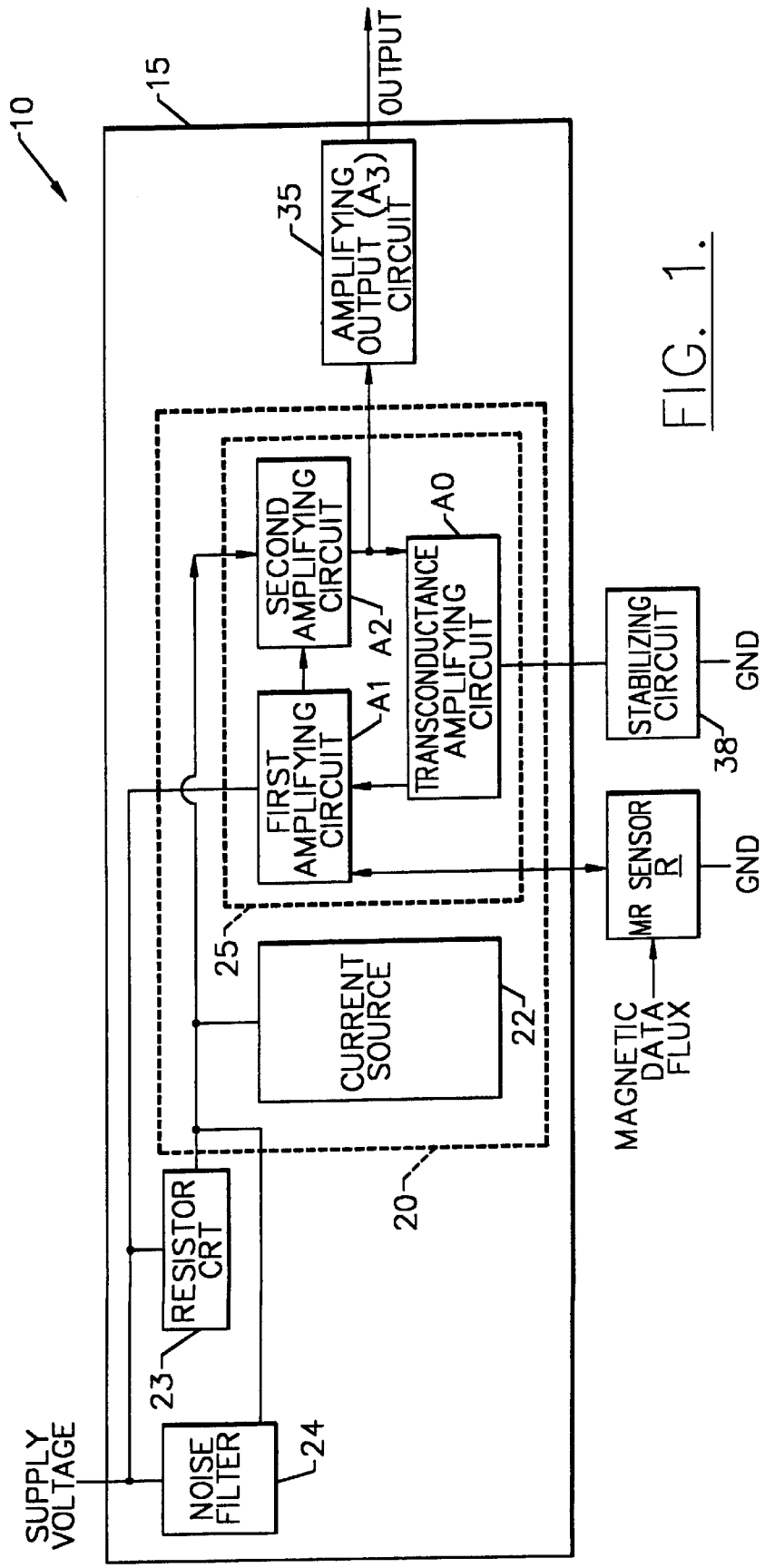
FIG. 1 is a schematic block diagram of a current-bias, current-sense preamplifier according to an embodiment of the present invention.

FIG. 1 illustrates a current-bias, current-sense preamplifier 10 for a magneto-resistive sensor R of a hard disk drive according to the present invention. As illustrated, the preamplifier includes a magneto-resistive (MR) sensor, e.g., preferably provided by an MR resistor R, responsive to a current bias $I_{bias}$ for sensing a change in magnetic data flux and responsively providing a change in electrical resistance. The preamplifier 10 also includes preamplifying means which is preferably provided by a preamplifying integrated circuit 15 connected to a supply voltage and to the MR sensor R for providing a current bias to the MR sensor R and for detecting the change in electrical resistance from the MR sensor R.

Figure 2:
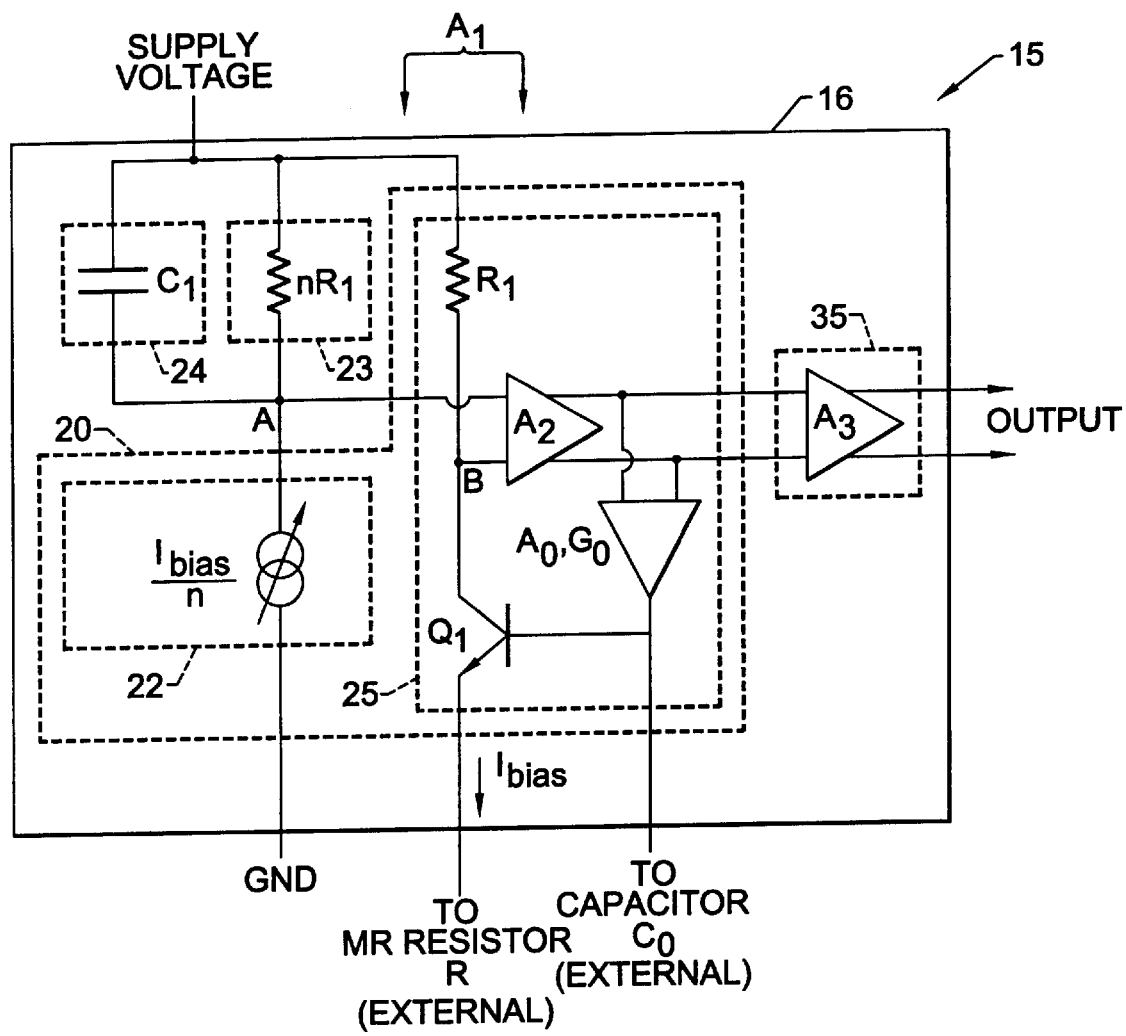
FIG. 2 is a schematic of a preamplifying integrated circuit according to an embodiment of the present invention.

As best illustrated in FIGS. 1–2, the preamplifying integrated circuit 15 preferably includes a substrate 16 and a current-source sensor biasing circuit 20 formed on the substrate 16, connected to ground, and a supply voltage for providing the current bias to the MR sensor R. An amplifying output circuit 35 is also formed on the substrate 16 and is connected to the current-source sensor biasing circuit 20 for providing an amplified output signal representative of the change in electrical resistance. The current-source sensor biasing circuit 20 has a current source 22 for generating a source current and a current biasing loop circuit 25 responsive to the current source 22 for providing the biasing current to an MR sensor R and for sensing a change in the biasing current responsive to a change in the electrical resistance of the MR sensor R. The preamplifying integrated circuit 15, in essence, advantageously can be broken down into three successive amplifying or gain circuits, i.e., stages A1, A2, A3 as illustrated. The current biasing loop circuit 25 preferably includes a first amplifying circuit or stage A1 adapted to be connected to an MR sensor R for biasingly driving the MR sensor R so as to detect the change in electrical resistance. A second amplifying circuit or stage A2 has a first input connected to the first amplifying circuit and a second input connected to the current source 22 for amplifying the difference between the first and second inputs. A transconductance amplifying circuit Ao has first and second inputs respectively connected to first and second outputs of the second amplifying circuit A2, has an output connected to the first amplifying circuit A1 and is adapted to be connected to a stabilizing circuit 38, e.g., an external capacitor Co, for providing an output current proportional to the voltage difference at the first and second inputs thereof. The output current advantageously drives the first amplifying circuit A1 so as to bias the MR sensor R.

More particularly, the first amplifying circuit or stage A1 is preferably implemented by an input transistor Q1 and a gain resistor R1, as well as the MR resistor R. As understood by those skilled in the art, the MR resistor R is connected between the emitter of the bipolar transistor Q1 (the actual preamplifier integrated circuit input) and ground GND. As also understood by those skilled in the art, several MR resistors with multiplexing switches also may actually be connected together in various ways according to the present invention. The second amplifying circuit A2 is preferably provided by a two-port differential amplifier and has a first input (node B) connected to the first amplifying circuit A1 and a second input (node A) connected to the current source 22 (see FIG. 2).

Biasing of the MR resistor R preferably is achieved indirectly by providing a reference voltage on node A which equals the product of a resistor circuit 23, e.g., preferably provided by at least a second resistor nR1, also formed on the substrate 16 which is multiplied by the bias current from the current source (nR1×Ibias/n)=R1×Ibias. The reference voltage on node A is also decoupled to the supply voltage by a noise filter circuit 24, e.g., preferably provided by an internal capacitor C1, which also is formed on the substrate 16 and forms a portion of the integrated circuit 15. If the predetermined multiple n is sufficiently large (typically n=10 or 20), the value of the internal capacitor C1 may be kept low enough, for example, to permit adequate decoupling of the noise coming from current source Ibias/n without the required use of an external component. The loop circuit 25 formed by the second amplifying circuit A2 and the operational transconductance amplifier Ao around the transistor Q1 and the first resistor R1, forces the voltages on nodes A and B to be equal, thereby operating the transistor Q1 and the MR sensor R at the desired bias level $I_{bias}$.

The preamplifier 10 further advantageously includes stabilizing means 38, e.g., preferably provided by an external capacitor $C_o$, connected to the current biasing loop circuit 25 of the preamplifying integrated circuit 15 and to ground for stabilizing the current biasing loop circuit 25. The external capacitor $C_o$ is preferably used as in conventional circuits as understood by those skilled in the art to stabilize the loop circuit 25 and to decouple the base of the transistor Q1. The third amplifying stage A3 or amplifying output circuit 35 is also preferably provided by a two-port differential amplifier and provides additional gain to the preamplifier output. As also understood by those skilled in the art, transconductors $g_o$ of the operational transconductance amplifier Ao may be boosted under some conditions to achieve faster settling of the biasing loop circuit 25, as is usually required to achieve fast recovery between operating modes of the system or at the end of a head switch.

Figure 3:
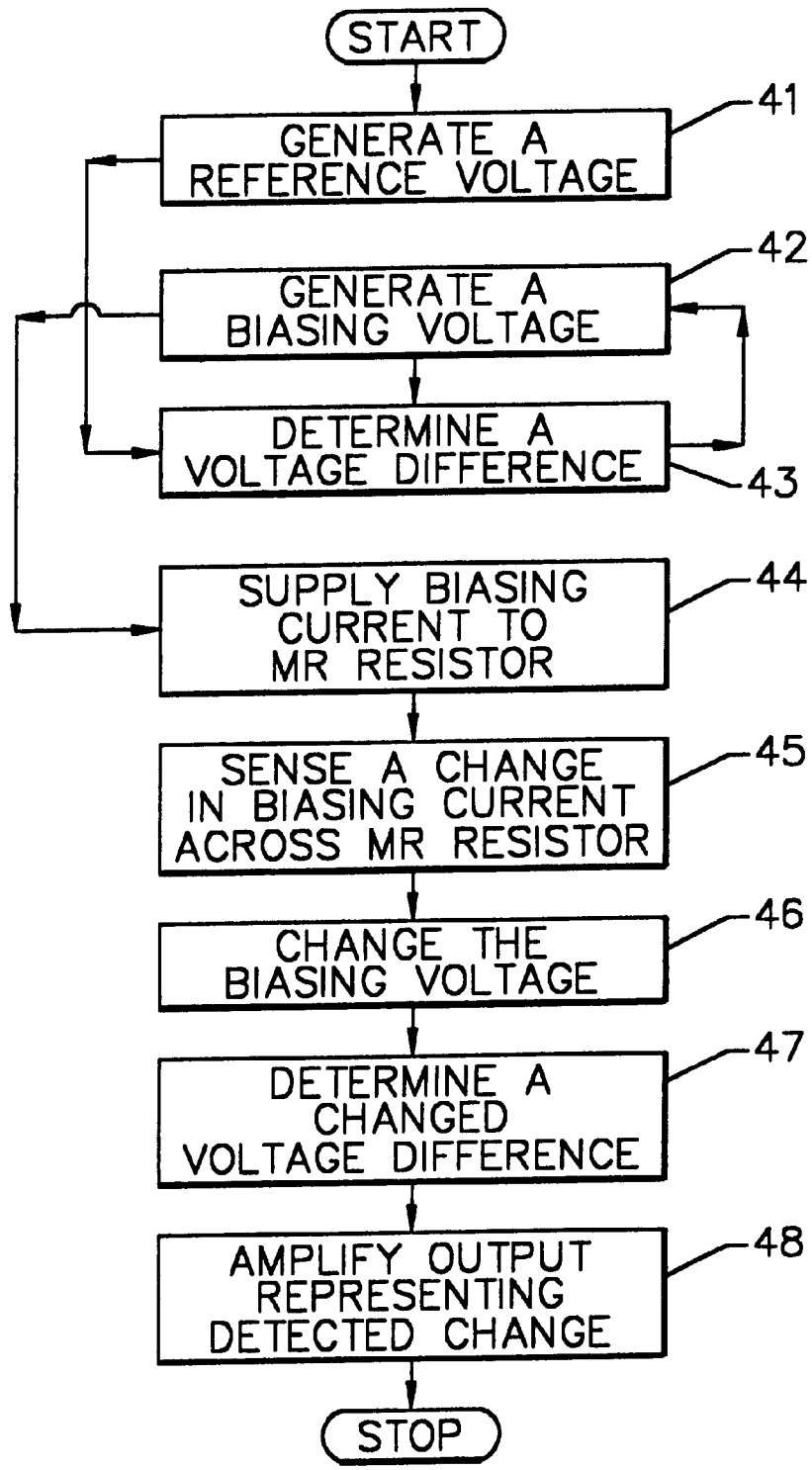
FIG. 3 is a flow diagram of a method of biasing a magneto-resistive sensor according to an embodiment of the present invention.

As illustrated in FIGS. 1–3, the present invention also advantageously provides methods of biasing an MR sensor R so as to detect a change in the electrical resistance of the MR sensor R. A method according to the present invention preferably includes generating a reference voltage responsive to a source current and a supply voltage and providing a first amplifying circuit A1 responsive to the supply voltage to thereby generate an initial biasing voltage so as to supply an initial biasing current across the MR sensor R and to thereby amplify a sensed change in the biasing current. The method also includes providing a second amplifying circuit A2 having first and second inputs respectively connected to the reference voltage and the initial biasing voltage to amplify a difference between the reference voltage and the initial biasing voltage. A transconductance amplifier Ao is further provided and is connected to the first amplifying circuit A1 and the outputs of the second amplifying circuit A2 to thereby generate a driving current for the first amplifying circuit proportional to the determined voltage difference between the reference voltage and the initial biasing voltage so that the first amplifying circuit A1 supplies a desired biasing current $I_{bias}$ as across the MR sensor R.

The method can also include sensing a change in the biasing current $I_{bias}$ across the MR sensor R responsive to a change in magnetic data flux and changing the biasing voltage supplied to the second input of the second amplifying circuit A2 responsive to the changed biasing current. A third amplifying circuit 35 is connected to the outputs of the second amplifying circuit A2 and can also advantageously amplify a voltage difference between the reference voltage and the changed biasing voltage to thereby provide an output signal representative of the detection of change in magnetic data flux by the MR sensor R. A capacitor Co connected to ground and the output of the transconductance amplifier Ao can further advantageously be provided to thereby stabilize a loop 25 defined by the first amplifying circuit A1, the second amplifying circuit A2 connected to the first amplifying circuit A1, and the transconductance amplifier Ao connected to the first and second amplifying circuits A1, A2.

As perhaps best illustrated in FIG. 3, another method of biasing an MR sensor R so as to detect a change in the electrical resistance of the MR sensor R according to the present invention preferably includes generating a reference voltage responsive to a source current 41 and generating a biasing voltage 42 approximately equal to the reference voltage responsive to a supply voltage so as to operate an MR sensor R at a desired biasing current $I_{bias}$ supplied from the first amplifying circuit 44. The method also includes sensing a change in the biasing current across the MR sensor R responsive to a change in magnetic data flux 45 and changing the biasing voltage responsive to the changed biasing current 46. A voltage difference between the reference voltage and the changed biasing voltage 47 is then amplified so as to provide an output signal representative of the detection of change in magnetic data flux 48 by the MR sensor R.

The step of generating a biasing voltage of the method preferably includes the steps of generating an initial biasing voltage responsive to the supply voltage 42, determining the voltage difference between the reference voltage and the initial biasing voltage 43, and adjusting the initial biasing voltage responsive to the determined voltage difference so that the biasing voltage approximately equals the reference voltage to thereby operate the MR sensor at the desired biasing current 42. Also, the step of generating the reference voltage 21 of the method preferably includes the steps of generating a source current from a current source 22, filtering noise via a filtering circuit 24 from the current source 22, and supplying the source current to a resistor nR1 having a predetermined value which is preferably a predetermined multiple of a resistor R1 of the first amplifying circuit A1.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. A preamplifier for a hard disk drive, the preamplifier comprising:

a magneto-resistive (MR) sensor responsive to a current bias for sensing a change in magnetic data flux and responsively providing a change in electrical resistance;

preamplifying means connected to a supply voltage and to said MR sensor for providing a current bias to said MR sensor and for amplifying a detected change in electrical resistance from said MR sensor, said preamplifying means including a current-source sensor biasing circuit for providing a desired biasing current to said MR sensor and an amplifying output circuit connected to said current-source sensor biasing circuit for providing an amplified output signal representative of the detected change in biasing current supplied to said MR sensor due to the change in electrical resistance, the current-source sensor biasing circuit including a current source for generating a source current, a first amplifying circuit connected to said MR sensor and to a supply voltage for sensing the change in electrical resistance from said MR sensor, a second amplifying circuit having a first input connected to the first amplifying circuit and a second input connected to the current source, and a transconductance amplifying circuit having first and second differential inputs respectively connected to first and second outputs of the second amplifying circuit and having an output connected to the first amplifying circuit for providing an output current proportional to the voltage difference at the first and second inputs thereof; and stabilizing means connected to said preamplifying means and to ground for stabilizing at least a portion of said preamplifying means.

2. A preamplifier as defined in claim 1, wherein said first amplifying circuit includes a transistor connected to said MR sensor and the first input of said second amplifying circuit and a resistor connected to the transistor and to the supply voltage.

3. A preamplifier as defined in claim 1, wherein said preamplifying means further includes a resistor connected to an output of said current source so that the current from the current source and the resistor define a reference voltage, the reference voltage being connected to the second input of the second amplifying circuit.

4. A preamplifier as defined in claim 3, wherein said preamplifying means further includes a capacitor connected to the supply voltage, the resistor, and the output of the current source for filtering noise from the current source.

5. A preamplifier as defined in claim 1, wherein said stabilizing means comprises a capacitor.

6. A preamplifier as defined in claim 1, wherein said preamplifying means comprises a preamplifying integrated circuit, the preamplifying integrated circuit having a substrate, a current source formed on the substrate so as to define the current source of said preamplifying means, a bipolar transistor formed on the substrate and having an emitter adapted to be connected to said MR sensor and a first resistor formed on the substrate and connected to a collector of the bipolar transistor and adapted to be connected to the supply voltage so that the transistor and resistor define the first amplifying circuit, a first differential amplifier formed on the substrate for defining the second amplifying circuit, and a second differential amplifier formed on the substrate for defining the amplifying output circuit.

7. A preamplifier as defined in claim 6, wherein said preamplifying integrated circuit further includes an operational transconductance amplifier formed on the substrate and connected to the base of the bipolar transistor for defining the transconductance amplifier.

8. A preamplifier as defined in claim 7, wherein the preamplifying integrated circuit further comprises a second resistor formed on the substrate and connected to an output of the current source so that the current from the current source and the second resistor define a reference voltage, the reference voltage being connected to the second input of the second amplifying circuit, and a capacitor formed on the substrate and connected to the supply voltage, the second resistor, and the output of the current source for filtering noise from the supply voltage.

9. A preamplifier as defined in claim 8, wherein the second resistor of the preamplifying integrated circuit comprises a second resistor value which is a predetermined multiple of the first resistor value, and wherein the current source generates a current which is a desired bias current for said MR sensor divided by the predetermined multiple.

10. A preamplifier for a hard disk drive, the preamplifier comprising:

a magneto-resistive (MR) sensor responsive to a current bias for sensing a change in magnetic data flux and responsively providing a change in electrical resistance; and a preamplifying integrated circuit connected to a supply voltage and to said MR sensor for providing a current bias to said MR sensor and for detecting the change in electrical resistance from said MR sensor, said preamplifying integrated circuit including a current-source sensor biasing circuit for providing the current bias to said MR sensor and an amplifying output circuit connected to said current-source sensor biasing circuit for providing an amplified output signal representative of the change in current bias to said MR sensor due to the change in electrical resistance, the current-source sensor biasing circuit including a current source connected to ground and a supply voltage for generating a source current and a current biasing loop circuit for sensing a change in the biasing current responsive to a change in the electrical resistance of said MR sensor, the current biasing loop circuit comprising a first amplifying circuit connected to said MR sensor and to a supply voltage for biasingly driving said MR sensor so as to provide the change in electrical resistance, a second amplifying circuit having a first input connected to the first amplifying circuit and a second input connected to the current source, and a transconductance amplifying circuit having first and second inputs respectively connected to first and second outputs of the second amplifying circuit and having an output connected to the first amplifying circuit for providing an output current proportional to the voltage difference at the first and second inputs thereof, the output current driving the first amplifying circuit so as to bias said MR sensor.

11. A preamplifier as defined in claim 10, wherein said first amplifying circuit of said current biasing loop circuit includes a bipolar transistor having an emitter connected to said MR sensor and a resistor connected to the collector of the bipolar transistor and to the supply voltage, the collector of said bipolar transistor also being connected to the first input of the second amplifying circuit.

12. A preamplifier as defined in claim 11, wherein said preamplifying means further includes a resistor connected to an output of said current source so that the current from the current source and the resistor define a reference voltage, the reference voltage being connected to the second input of the second amplifying circuit of said current biasing loop circuit.

13. A preamplifier as defined in claim 12, wherein said preamplifying means further includes a capacitor connected to the supply voltage, the resistor, and the output of the current source for filtering noise from the current source.

14. A preamplifier as defined in claim 13, further comprising an external capacitor connected to said current biasing loop circuit of said preamplifying integrated circuit and to ground for stabilizing said current biasing loop circuit.

15. A preamplifier as defined in claim 10, wherein said preamplifying means comprises a preamplifying integrated circuit, the preamplifying integrated circuit having a substrate, a current source formed on the substrate so as to define the current source of said preamplifying means, a bipolar transistor formed on the substrate and having an emitter adapted to be connected to said MR sensor and a first resistor formed on the substrate and connected to a collector of the bipolar transistor and adapted to be connected to the supply voltage so that the transistor and resistor define the first amplifying circuit of said current biasing loop circuit, a first differential amplifier formed on the substrate for defining the second amplifying circuit of said current biasing loop circuit, and a second differential amplifier formed on the substrate for defining the output amplifying circuit.

16. A preamplifier as defined in claim 15, wherein said preamplifying integrated circuit further includes an operational transconductance amplifier formed on the substrate and connected to the base of the bipolar transistor for defining the transconductance amplifier of said current biasing loop circuit.

17. A preamplifier as defined in claim 16, wherein the preamplifying integrated circuit further comprises a second resistor formed on the substrate and connected to an output of the current source so that the current from the current source and the second resistor define a reference voltage, the reference voltage being connected to the second input of the second amplifying circuit, and an internal capacitor formed on the substrate and connected to the supply voltage, the second resistor, and the output of the current source for filtering noise from the supply voltage.

18. A preamplifier as defined in claim 17, wherein the second resistor of the preamplifying integrated circuit comprises a second resistor value which is a predetermined multiple of the first resistor value, and wherein the current source generates a current which is a desired bias current for said MR sensor divided by the predetermined multiple.

19. A preamplifying integrated circuit adapted to be connected to a supply voltage and to a magneto-resistive (MR) sensor for providing a current bias to the MR sensor and for detecting the change in electrical resistance from the MR sensor, the integrated circuit comprising:

a substrate;

a current-source sensor biasing circuit formed on said substrate for providing the current bias to the MR sensor, the current-source sensor biasing circuit including a current source for generating a source current and a current biasing loop circuit responsive to said current source for providing the biasing current to an MR sensor and for sensing a change in the biasing current responsive to a change in the electrical resistance of the MR sensor, the current biasing loop circuit comprising a first amplifying circuit adapted to be connected to an MR sensor for biasingly driving the MR sensor so as to detect the change in electrical resistance, a second amplifying circuit having a first input connected to the first amplifying circuit and a second input connected to the current source, and a transconductance amplifying circuit having first and second inputs respectively connected to first and second outputs of the second amplifying circuit and having an output connected to the first amplifying circuit and adapted to be connected to an external capacitor for providing an output current proportional to the voltage difference at the first and second inputs thereof, the output current driving the first amplifying circuit so as to bias the MR sensor; and an amplifying output circuit formed on said substrate and connected to the current-source sensor biasing circuit for providing an amplified output signal representative of the change in current bias to the MR sensor due to the change in electrical resistance.

20. A preamplifying integrated circuit as defined in claim 19, wherein said first amplifying circuit of said current biasing loop circuit includes a bipolar transistor having an emitter adapted to be connected to an MR sensor and a resistor connected to the collector of the bipolar transistor and adapted to be connected to the supply voltage, the collector of said bipolar transistor also being connected to the first input of the second amplifying circuit.

21. A preamplifying integrated circuit as defined in claim 20, wherein the resistor of the first amplifying circuit comprises a first resistor, and the preamplifying integrated circuit further comprising a second resistor formed on said substrate, connected to an output of said current source, and adapted to be connected to a supply voltage so that the current from the current source and the second resistor define a reference voltage, the reference voltage being connected to the second input of the second amplifying circuit of said current biasing loop circuit.

22. A preamplifying integrated circuit as defined in claim 21, further comprising an internal capacitor formed on said substrate, connected to the second resistor and the output of the current source, and adapted to be connected to the supply voltage for filtering noise from the current source.

23. A preamplifying integrated circuit as defined in claim 22, wherein the second resistor of the preamplifying integrated circuit comprises a second resistor value which is a predetermined multiple of the first resistor value, and wherein the current source generates a current which is a desired bias current for an MR sensor divided by the predetermined multiple.

24. A method of biasing a magneto-resistive (MR) sensor so as to detect a change in the electrical resistance of the MR sensor, the method comprising the steps of:

generating a reference voltage responsive to a source current and a supply, voltage;

providing a first amplifying circuit responsive to the supply voltage to thereby generate an initial biasing voltage so as to supply an initial biasing current across the MR sensor and to thereby amplify a sensed change in the biasing current;

providing a second amplifying circuit having first and second inputs respectively connected to the reference voltage and the initial biasing voltage to amplify a difference between the reference voltage and the initial biasing voltage; and providing a transconductance amplifier connected to the first amplifying circuit and the outputs of the second amplifying circuit to thereby generate a driving current for the first amplifying circuit proportional to the determined voltage difference between the reference voltage and the initial biasing voltage so that the first amplifying circuit supplies a desired biasing current across the MR sensor.

25. A method as defined in claim 24, further comprising sensing a change in the biasing current across the MR sensor responsive to a change in magnetic data flux and changing the biasing voltage supplied to the second input of the second amplifying circuit responsive to the changed biasing current.

26. A method as defined in claim 25, further comprising providing a third amplifying circuit connected to the outputs of the second amplifying circuit to amplify a voltage difference between the reference voltage and the changed biasing voltage and thereby provide an output signal representative of the detection of change in magnetic data flux by the MR sensor.

27. A method as defined in claim 26, further comprising providing a capacitor connected to ground and the output of the transconductance amplifier to thereby stabilize a loop defined by the first amplifying circuit, the second amplifying circuit connected to the first amplifying circuit, and the transconductance amplifier connected to the first and second amplifying circuits.

* * * * *